US008705218B2

(12) United States Patent
Ho

(10) Patent No.: US 8,705,218 B2
(45) Date of Patent: *Apr. 22, 2014

(54) INPUT BUFFER PROTECTION

(75) Inventor: Michael V. Ho, Allen, TX (US)

(73) Assignee: Micron Technology, Inc., Boise, ID (US)

(*) Notice: Subject to any disclaimer, the term of this patent is extended or adjusted under 35 U.S.C. 154(b) by 40 days.

This patent is subject to a terminal disclaimer.

(21) Appl. No.: 13/458,815

(22) Filed: Apr. 27, 2012

(65) Prior Publication Data

US 2012/0215943 A1     Aug. 23, 2012

Related U.S. Application Data

(63) Continuation of application No. 12/020,967, filed on Jan. 28, 2008, now Pat. No. 8,169,759.

(51) Int. Cl.
*H02H 9/00* (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 4,888,500 A * | 12/1989 | Nicollini et al. | 326/71 |
| 6,240,028 B1 | 5/2001 | Ho | |
| 6,557,090 B2 | 4/2003 | Ho | |
| 6,707,722 B2 | 3/2004 | Ho et al. | |
| 6,788,122 B2 * | 9/2004 | Jones, Jr. | 327/202 |
| 6,826,092 B2 | 11/2004 | Ho | |
| 6,847,511 B2 | 1/2005 | Ohnakado et al. | |
| 6,848,040 B2 | 1/2005 | Ho | |
| 6,882,209 B1 * | 4/2005 | Isbara | 327/390 |
| 7,096,304 B2 | 8/2006 | Ho et al. | |
| 7,123,068 B1 * | 10/2006 | Hoover et al. | 327/202 |
| 7,123,522 B2 | 10/2006 | Ho et al. | |
| 7,185,173 B2 | 2/2007 | Ho | |
| 7,583,121 B2 * | 9/2009 | Berzins et al. | 327/202 |
| 8,169,759 B2 | 5/2012 | Ho | |
| 2001/0054740 A1 | 12/2001 | Marr | |
| 2005/0077916 A1 | 4/2005 | Mecier et al. | |
| 2006/0220717 A1 * | 10/2006 | Padhye et al. | 327/218 |
| 2008/0316660 A1 | 12/2008 | Huang et al. | |
| 2009/0191836 A1 | 7/2009 | Ho | |
| 2011/0032647 A1 | 2/2011 | Kawachi | |

FOREIGN PATENT DOCUMENTS

EP      0840453 A2      5/1998

OTHER PUBLICATIONS

Streetman, Ben G, "Solid State Electronic Devices, 4th edition, Prentice Hall", (1995), 322-323.

* cited by examiner

*Primary Examiner* — Scott Bauer
(74) *Attorney, Agent, or Firm* — Schwegman, Lundberg & Woessner, P.A.

(57) ABSTRACT

Apparatus, systems, and methods are disclosed that operate to boost an electrical potential of a control terminal of a transistor from a signal on an input terminal of the transistor to render a channel in the transistor more conductive. Additional apparatus, systems, and methods are disclosed.

30 Claims, 6 Drawing Sheets

INPUT BUFFER PROTECTION

PRIORITY APPLICATION

This application is a continuation of U.S. application Ser. No. 12/020,967, filed Jan. 28, 2008 now U.S. Pat. No. 8,169,759, which is incorporated herein by reference in its entirety.

BACKGROUND

Electrostatic discharge (ESD) is the sudden and momentary unwanted electric current that flows between two objects at different electrical potentials. ESD currents may cause damage to integrated circuits. Input pins on integrated circuits can include ESD protection devices. One type of ESD protection is to isolate a signal from an external pin by coupling it through a pass gate or a resistor before the signal reaches other circuits in an integrated circuit. The pass gate or the resistor form a barrier between ESD and components in the integrated circuit such that the components do not see voltage stress when external pins are driven to extreme conditions or ring above their normal operating range.

DETAILED DESCRIPTION

The inventor has discovered that using a low to high transition of an external signal to boost a potential of a gate of a transistor in an integrated circuit such that the external signal passes through the transistor improves the detection of the external signal in circuits beyond the transistor. The transition of the external signal may indicate an end of a power down mode of operation in the integrated circuit receiving the external signal. The improvement is effected without adding elements to the transistor or an additional transistor.

The term "source/drain" refers generally to the terminals or diffusion regions of a field effect transistor. A terminal or a diffusion region may be more specifically described as a "source" or a "drain" on the basis of a voltage applied to it when the field effect transistor is in operation.

In this description, a transistor is described as being activated or switched on when it is rendered conductive by a control terminal voltage that is separated from its source voltage by at least its threshold voltage. The transistor is described as being in an inactive state or switched off when the control terminal voltage is separated from its source voltage by less than the threshold voltage and the transistor is rendered non-conductive.

Figure 1:
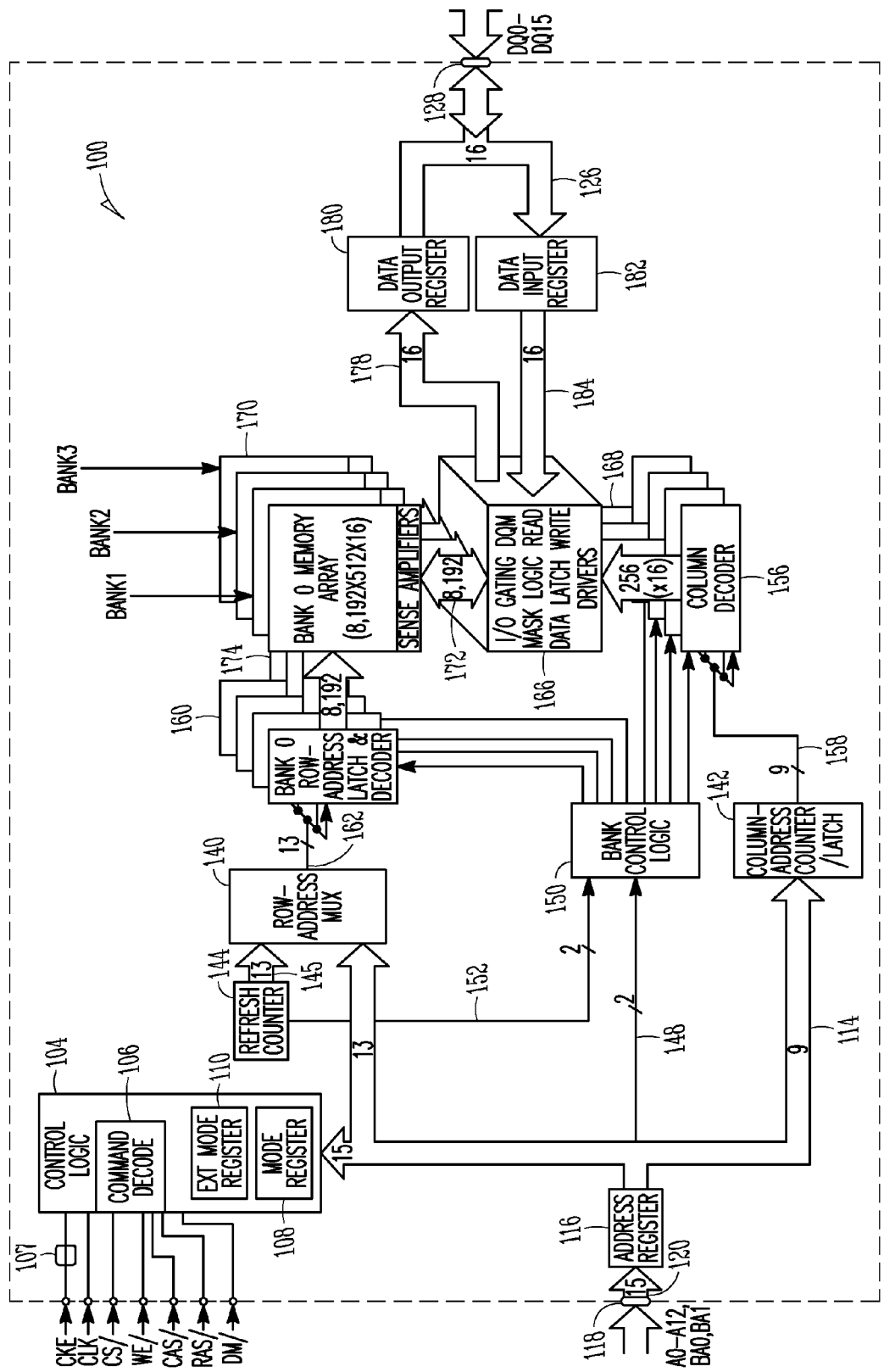
FIG. 1 is a block diagram of a memory device according to an embodiment of the invention.

FIG. 1 is a block diagram of a memory device 100 according to an embodiment of the invention. The memory device 100 includes a control logic circuit 104 coupled to receive external command signals from a memory control circuit (not shown).

The external command signals include a clock enable signal CKE and a clock signal CLK. The clock enable signal CKE is a signal indicating validity of the following clock signal CLK. The external command signals also include a chip select signal CS/, a write enable signal WE/, a column address strobe signal CAS/, a row address strobe signal RAS/, and a data-mask signal DM/. The "/" designation indicates that the signal is active low. The external command signals are decoded in a command decode circuit 106. The clock enable signal CKE is coupled to the control logic circuit 104 through an input buffer (IB) system 107 according to an embodiment of the invention.

The memory device 100 has one or more mode registers 108 and extended mode registers 110 that are programmed with information for operating the memory device 100. The memory device 100 also includes an address bus 114 that receives address bits A0-A12, BA0, and BA1 from an address register 116. The address register 116 receives the address bits A0-A12, BA0, and BA1 from a source external to the memory device 100 through a port 118 and a bus 120. The memory device 100 also includes a data bus 126 that receives and transmits data bits DQ0-DQ15 through a port 128.

The chip select signal CS/ is a signal used to select one device, such as the memory device 100, out of several devices connected to the same bus. A low CS/ signal enables the command decode circuit 106 in the memory device 100, and a high CS/ disables the command decode circuit 106. All commands are masked from the memory device 100 when the CS/ signal is high, but READ/WRITE bursts already in progress will continue to completion, and a data mask (DQM) operation will retain its DQ mask capability while CS/ is high. Thus, the low CS/ signal enables a device connected to a bus to respond to commands and data on the bus while the high CS/ signal tells the device to ignore the bus. The CS/ signal provides for external bank selection on systems with multiple banks.

The address bits A0-A12, BA0, and BA1 are captured on a falling edge of the row address strobe signal RAS/, and a row of memory cells in an array of memory cells corresponding to the address is opened. The row is held open as long as the row address strobe signal RAS/ is low. Address inputs are captured on a falling edge of the column address strobe signal CAS/, and a column of the memory cells in the array of memory cells corresponding to the captured address is selected from the currently open row for a read or write operation.

The write enable signal WE/ determines whether a given falling edge of the column address strobe signal CAS/ initiates a read or a write operation. A high write enable signal WE/ directs a read operation, while a low write enable signal WE/ directs a write operation. If the write enable signal WE/ is low, data is captured at inputs on the falling edge of the column address strobe signal CAS/. The signals WE/, CAS/, RAS/, and CS/ can, in various combinations, represent other commands not described above.

The data-mask signal DM/ controls input over the data bus 126 during write operations. The data bus 126 is activated to carry data to the memory device 100 if the data-mask signal DM/ is low, and data on the data bus 126 is masked from the memory device 100 if the data-mask signal DM/ is high.

Management of read and write operations is performed by the control logic circuit 104 upon receiving the external command signals. The mode registers 108 and the extended mode registers 110 have operating information that is programmed by a memory controller (not shown) on initialization or boot-up of the memory device 100. According to some embodiments, the memory device 100 comprises a dynamic random access memory (DRAM) device or a synchronous dynamic random access memory (SDRAM) device.

The memory device 100 can be formed on a semiconductor die using a substrate, where the substrate is a material such as silicon, germanium, silicon on sapphire, gallium arsenide, or other semiconductor material. The elements of the memory device 100 are fabricated using conventional processing, well-known to those of ordinary skill in the art, to form the various circuits within the semiconductor material and for providing electrical connections for coupling to an address bus, a data bus, and control lines for communication with a controller or a processor.

The address bits A0-A12, BA0, and BA1 are coupled from the address bus 114 to the mode register 108 and the extended mode register 110 in the control logic circuit 104, a row address multiplexer 140, and a column address counter/latch 142. A refresh counter circuit 144 generates address bits that are coupled on a bus 145 to the row address multiplexer 140. The row address multiplexer 140 and the column address counter/latch 142 hold the address bits A0-A12, BA0, and BA1. Two address lines 148 from the address bus 114 are coupled to a bank control logic circuit 150, and two address lines 152 are coupled from the refresh counter circuit 144 to the bank control logic circuit 150. The bank control logic circuit 150 stores address bits to be used to select a bank of memory cells. Address bits in the column address counter/latch 142 are coupled to a plurality of column decoder circuits 156 over a plurality of lines 158. Similarly, address bits in the row address multiplexer 140 are coupled to bank row address latch and decoder circuits 160 over a plurality of lines 162.

The column decoder circuits 156 decodes the address bits from the column address counter/latch 142 and couples the decoded signals to a plurality of circuits 166 including an input/output (I/O) gating circuit, a DQM mask logic circuit, read data latch circuits, and write driver circuits over a plurality of lines 168. The circuits 166 select columns of memory cells in a bank of memory arrays 170 through a plurality of lines 172. The bank row address latch and decoder circuits 160 select rows of memory cells in the bank of memory arrays 170 through a plurality of lines 174. A data bit is written to or read from a selected memory cell in the bank of memory arrays 170 located in a column selected by the circuits 166 and a row selected by the bank row address latch and decoder circuit 160. The refresh counter circuit 144 generates refresh address bits to periodically refresh the memory cells in the bank of memory arrays 170, the refresh address bits being coupled to the row address multiplexer 140 through the bus 145 and to the bank control logic circuit 150 through the lines 152. The address bits received by the bank control logic circuit 150 on the lines 148 or 152 select one of the bank row address latch and decoder circuits 160 and one of the column decoder circuits 156 that, in turn, select a memory cell in the bank of memory arrays 170.

Data bits read from the memory cells in the bank of memory arrays 170 are coupled through the circuits 166 and a bus 178 to a data output register 180 where the data bits are stored. Data bits stored in the data output register 180 are then coupled to the bus 126 and transmitted through the port 128.

Similarly, data bits to be written to the memory cells in the bank of memory arrays 170 are received from the bus 126 through a data input register 182, where the data bits are stored temporarily, before being coupled over a bus 184 to the circuits 166 from which the data bits are written to memory cells in the bank of memory arrays 170.

Figure 2:
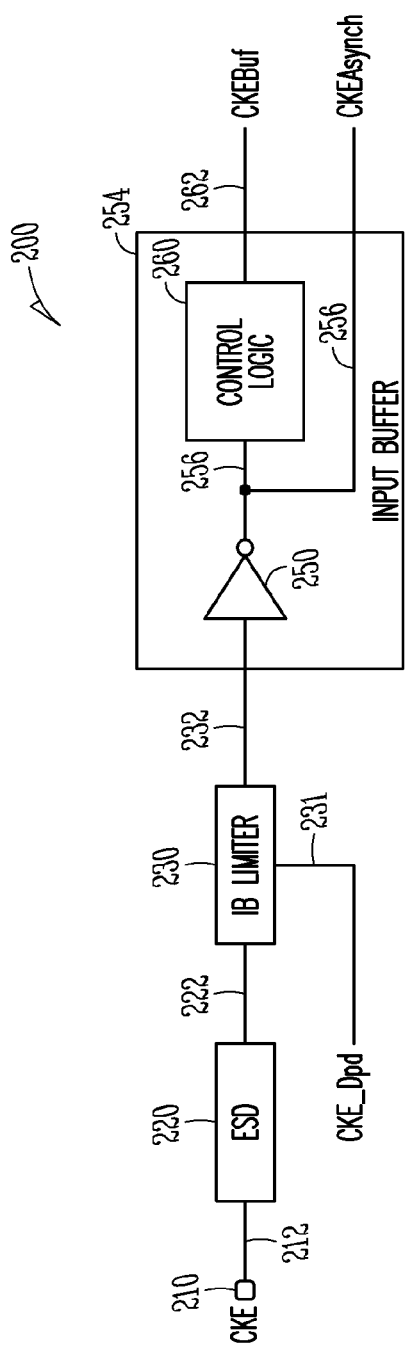
FIG. 2 is a block diagram of an input buffer (IB) system according to an embodiment of the invention.
Figure 6:
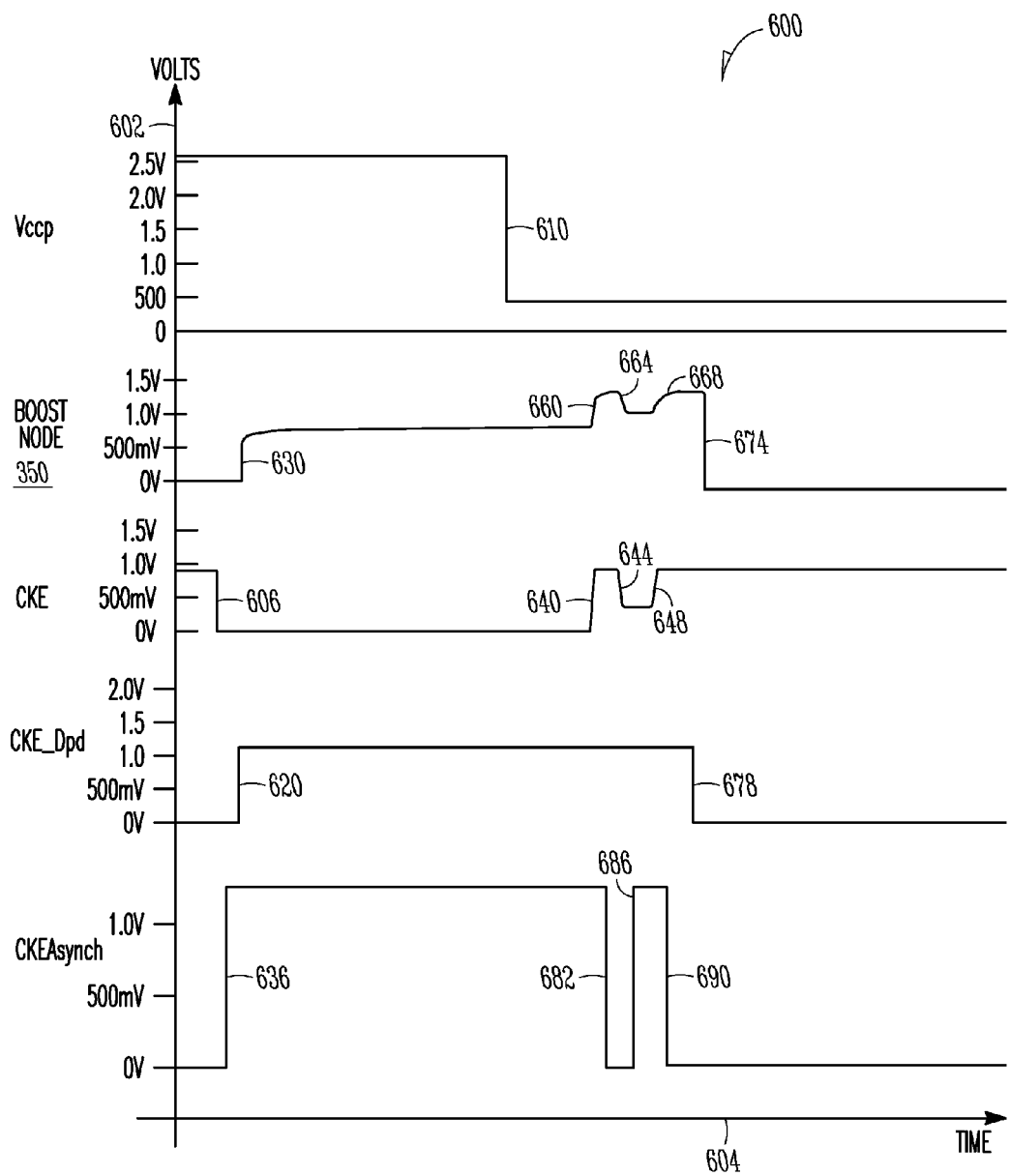
FIG. 6 is a timing chart of signals related to a device including the IB system shown in FIG. 2 and the IB limiter circuit shown in FIG. 3 according to an embodiment of the invention.

FIG. 2 is a block diagram of an IB system 200 according to an embodiment of the invention. The IB system 200 is shown as the IB system 107 in FIG. 1 according to an embodiment of the invention. The clock enable signal CKE is received at an external terminal 210 that is external to the memory device 100 shown in FIG. 1. The external terminal 210 is coupled through a line 212 to an electrostatic discharge (ESD) circuit 220 to protect the memory device 100 from electrostatic discharge. The clock enable signal CKE is then coupled through a line 222 to an IB limiter circuit 230 that will be described below in greater detail. The IB limiter circuit 230 receives a control signal CKE_Dpd on a line 231, and the clock enable signal CKE is coupled through a line 232 to an input of an inverter 250 in an IB circuit 254. The inverter 250 generates a signal CKEAsynch at an output on a line 256 extending out of the IB circuit 254. The signal CKEAsynch is the clock enable signal CKE inverted. The signal CKEAsynch is also coupled to an input of a control logic circuit 260, and the control logic circuit 260 generates a buffered clock enable signal CKEBuf on a line 262 extending out of the IB circuit 254. The control signal CKE_Dpd is generated in the memory device 100. The clock enable signal CKE, the control signal CKE_Dpd, and the signal CKEAsynch are shown in FIG. 6 and described below.

Figure 3:
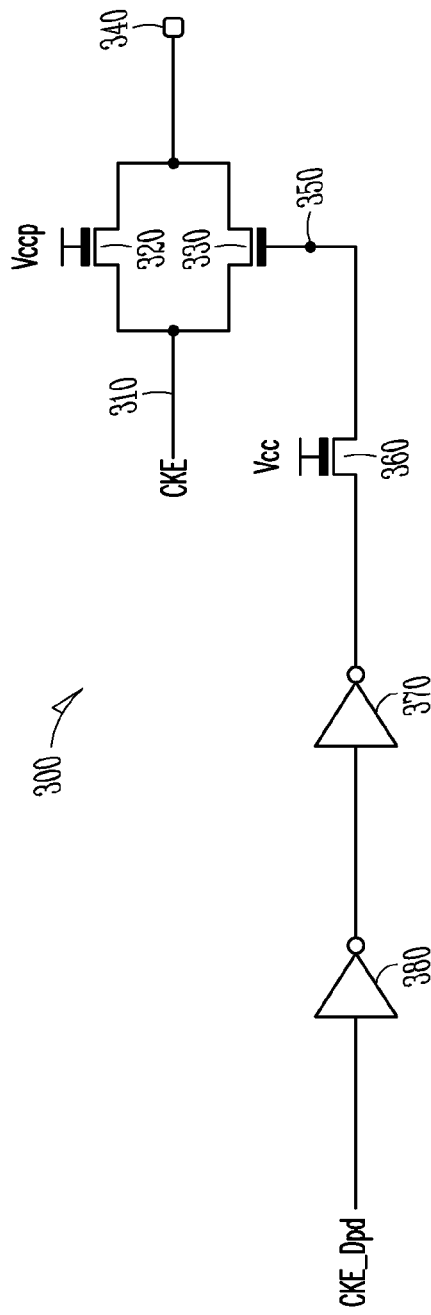
FIG. 3 is an electrical schematic diagram of an IB limiter circuit according to an embodiment of the invention.

FIG. 3 is an electrical schematic diagram of an IB limiter circuit 300 according to an embodiment of the invention. The IB limiter circuit 300 is shown as the IB limiter circuit 230 in FIG. 2 according to an embodiment of the invention. The clock enable signal CKE is received on a line 310 that is coupled to a source of a first transistor 320 and to a source of a boost transistor 330. A drain of the first transistor 320 and a drain of the boost transistor 330 are coupled to an output pin 340 that receives the clock enable signal CKE when either the first transistor 320 or the boost transistor 330 are switched on or rendered conductive. The first transistor 320 includes a gate coupled to an internal supply voltage Vccp. A gate of the boost transistor 330 is coupled to a boost node 350 that is coupled to a drain of a third transistor 360. A gate of the third transistor 360 is coupled to an external supply voltage Vcc. A source of the third transistor 360 is coupled to an output of a first inverter 370. An input of the first inverter 370 is coupled to an output of a second inverter 380, and an input of the second inverter 380 is coupled to receive the control signal CKE_Dpd. The first transistor 320, the boost transistor 330, and the third transistor 360 are N-channel transistors.

A potential at the boost node 350 is boosted by a low to high transition of the clock enable signal CKE such that the boost transistor 330 is rendered more conductive and the clock enable signal CKE passes through the boost transistor 330 to the output pin 340. The third transistor 360 and the inverters 370 and 380 pre-charge the boost node 350 to switch on the boost transistor 330 according to the control signal CKE_Dpd, and the operation of the IB limiter circuit 300 will be more fully described below with respect to FIG. 6. The embodiments of the invention shown and described herein improve the detection of the transition of the clock enable signal CKE in circuits beyond the output pin 340. The transition of the clock enable signal CKE may indicate an end of a power down mode of operation in the memory device 100.

Figure 4:
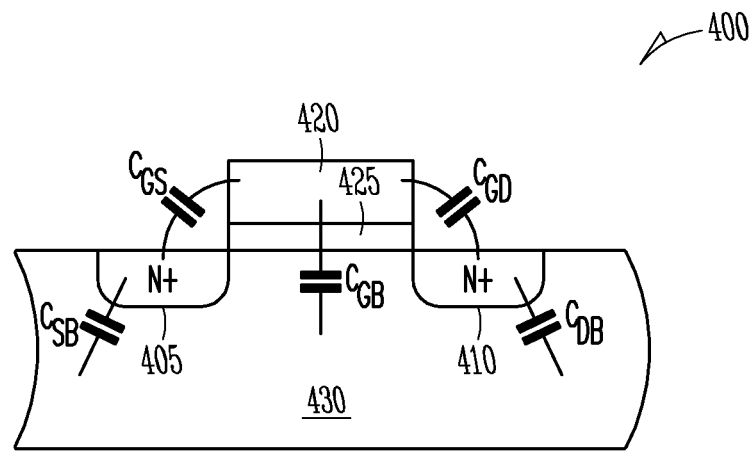
FIG. 4 is a cross-sectional view of a field effect transistor according to an embodiment of the invention.

FIG. 4 is a cross-sectional view of a field effect transistor 400 according to an embodiment of the invention. The field effect transistor 400 is one example of the boost transistor 330 according to an embodiment of the invention. The field effect transistor 400 includes a source 405, a drain 410, and a gate 420. The gate 420 may also be called a control terminal or an electrode. A gate insulator 425 is interposed between the gate 420 and a substrate 430. In one embodiment, the substrate 430 is a bulk semiconductor, such as silicon. In another embodiment, the substrate 430 includes a thin semiconductor surface layer formed on an underlying insulating portion, such as in a semiconductor-on-insulator (SOI) or other thin film transistor technology. The field effect transistor 400 is a thin oxide field effect transistor according to some embodiments of the invention.

The boost of the potential on the boost node 350 through the boost transistor 330 shown in FIG. 3 and described above makes use of parasitic capacitances in the boost transistor 330. With reference to the field effect transistor 400 shown in FIG. 4, a parasitic capacitance $C_{GB}$ exists between the gate 420 and the substrate 430. A parasitic capacitance $C_{GS}$ exists between the gate 420 and the source 405. A parasitic capacitance $C_{GS}$ exists between the gate 420 and the drain 410. A parasitic capacitance $C_{SB}$ exists between the source 405 and the substrate 430, and a parasitic capacitance $C_{DB}$ exists between the drain 410 and the substrate 430.

Figure 5:
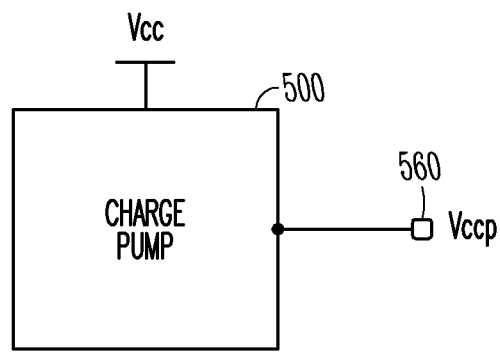
FIG. 5 is a block diagram of a charge pump circuit according to an embodiment of the invention.

FIG. 5 is a block diagram of a charge pump circuit 500 according to an embodiment of the invention. The charge pump circuit 500 is located in the memory device 100 shown in FIG. 1 to generate the internal supply voltage Vccp on a node 560 from the external supply voltage Vcc. The internal supply voltage Vccp is pumped by the charge pump circuit 500 to be higher than the external supply voltage Vcc. The internal supply voltage Vccp is shown in FIG. 6 and described below.

FIG. 6 is a timing chart 600 of signals related to a device including the IB system 200 shown in FIG. 2 and the IB limiter circuit 300 shown in FIG. 3 according to an embodiment of the invention. The device may be the memory device 100 shown in FIG. 1 according to an embodiment of the invention. The timing chart 600 shows the internal supply voltage Vccp, the potential at the boost node 350, the clock enable signal CKE, the control signal CKE_Dpd, and the signal CKEAsynch. The signal CKEAsynch is generated by the IB circuit 254 shown in FIG. 2. The internal supply voltage Vccp is internal to a device including the IB limiter circuit 300 and is generated by the charge pump circuit 500 shown in FIG. 5. Voltages are shown with respect to a vertical axis 602, and time is shown progressing with respect to a horizontal axis 604.

The clock enable signal CKE is nearly 1 volt during operation of the device and drops with a falling edge 606 to ground or 0 volts to indicate the beginning of a sleep mode of operation. The internal supply voltage Vccp is high, approximately 2.5 volts, while the device is operating and drops with a falling edge 610 to approximately 500 mV after the device enters the sleep mode of operation. The control signal CKE_Dpd is usually low at ground or 0 volts and lifts with a rising edge 620 at the beginning of the sleep mode to precharge the boost node 350 through the third transistor 360 and the inverters 370 and 380. The potential of the boost node 350 increases with a rising edge 630 from ground or 0 volts to approximately 1 volt as a result of the rise in the control signal CKE_Dpd to switch on the boost transistor 330. The boost node 350 is precharged to approximately the external supply voltage Vcc on the gate of the third transistor 360 less a threshold voltage of the third transistor 360. The signal CKEAsynch goes high with a rising edge 636 as it is inverted from the clock enable signal CKE by the inverter 250 shown in FIG. 2.

The clock enable signal CKE rises twice to indicate an end to the sleep mode. The clock enable signal CKE has a rising edge 640, a falling edge 644, and then a second rising edge 648 to signal the end of the sleep mode. The potential of the boost node 350 increases with the increase in the clock enable signal CKE with a rising edge 660, dropping with a falling edge 664, and increasing a second time with a rising edge 668. The potential of the boost node 350 is boosted by the rising clock enable signal CKE due to the parasitic capacitance $C_{GS}$ that exists between the gate and the source of the boost transistor 330. The boost node 350 discharges with a falling edge 674 to ground or 0 volts once the device receives the clock enable signal CKE indicating the end of the sleep mode to switch off the boost transistor 330. The control signal CKE_Dpd also drops at the end of the sleep mode with a falling edge 678 to ground or 0 volts. With reference to FIG. 3, the boost node 350 discharges through the third transistor 360 after the control signal CKE_Dpd drops. The signal CKEAsynch drops with a falling edge 682, increases with a rising edge 686, and drops with a falling edge 690 in response to the changes in the clock enable signal CKE.

The potential of the boost node 350 is boosted by the low to high transition of clock enable signal CKE between the rising edge 660 and the falling edge 674 such that the boost transistor 330 is rendered more conductive and the clock enable signal CKE passes through the boost transistor 330 to the output pin 340 shown in FIG. 3.

Figure 7:
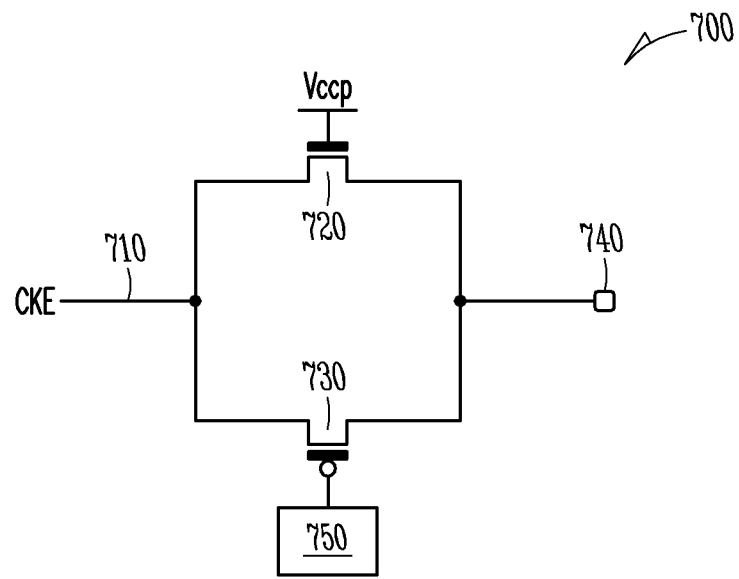
FIG. 7 is an electrical schematic diagram of an IB limiter circuit according to an embodiment of the invention.

FIG. 7 is an electrical schematic diagram of an IB limiter circuit 700 according to an embodiment of the invention. The IB limiter circuit 700 is shown as the IB limiter circuit 230 in FIG. 2 according to an embodiment of the invention. The clock enable signal CKE is received on a line 710 that is coupled to a source of a first transistor 720 and to a drain of a boost transistor 730. A drain of the first transistor 720 and a source of the boost transistor 730 are coupled to an output pin 740 that receives the clock enable signal CKE when either the first transistor 720 or the boost transistor 730 are switched on or rendered conductive. The first transistor 720 is an N-channel transistor and the boost transistor 730 is a P-channel transistor. The first transistor 720 includes a gate coupled to the internal supply voltage Vccp. A gate of the boost transistor 730 is coupled to a circuit 750 that is configured to enable a potential at the gate of the boost transistor 730 to be reduced by a low to high transition of the clock enable signal CKE such that the boost transistor 730 is rendered more conductive and the clock enable signal CKE passes through the boost transistor 730 to the output pin 740.

Figure 8:
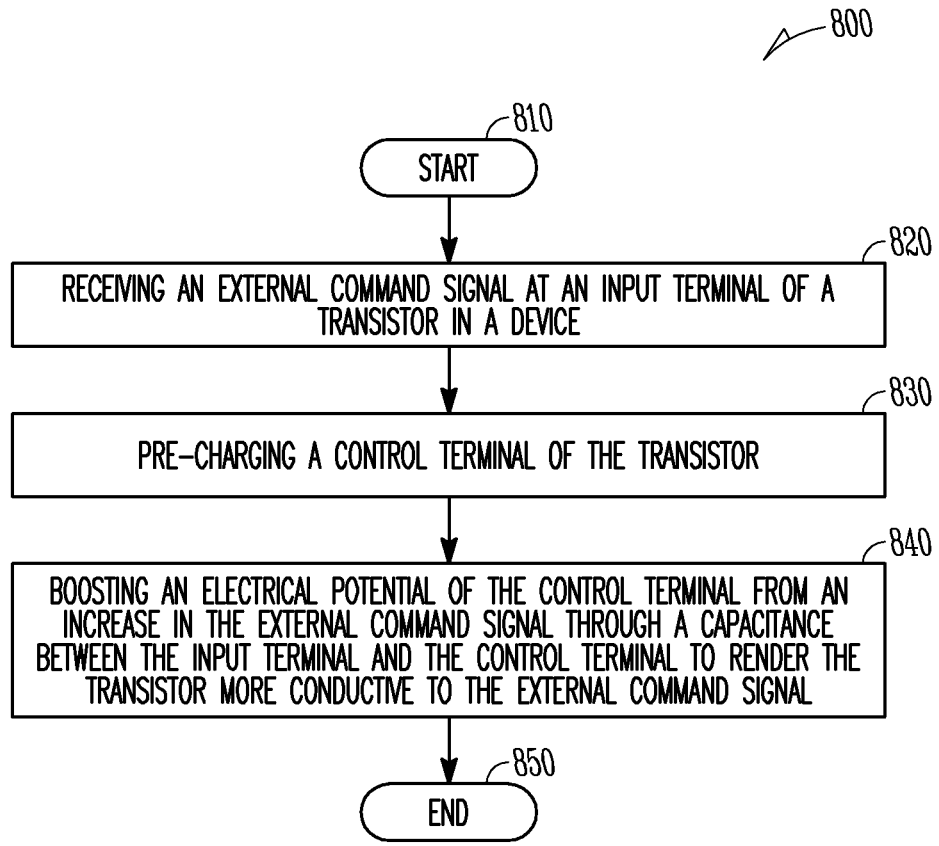
FIG. 8 is a flow diagram of several methods according to an embodiment of the invention.

FIG. 8 is a flow diagram of several methods 800 according to an embodiment of the invention. In block 810, the methods 800 start. In block 820, an external command signal is received at an input terminal of a transistor in a device. In block 830, a control terminal of the transistor is precharged. In block 840, an electrical potential of the control terminal is boosted from an increase in the external command signal through a capacitance between the input terminal and the control terminal to render the transistor more conductive to the external command signal. In block 850, the methods 800 end.

The individual activities of methods 800 may not have to be performed in the order shown or in any particular order. Some activities may be repeated, and others may occur only once. Embodiments of the invention may have more or fewer activities than those shown in FIG. 8.

Figure 9:
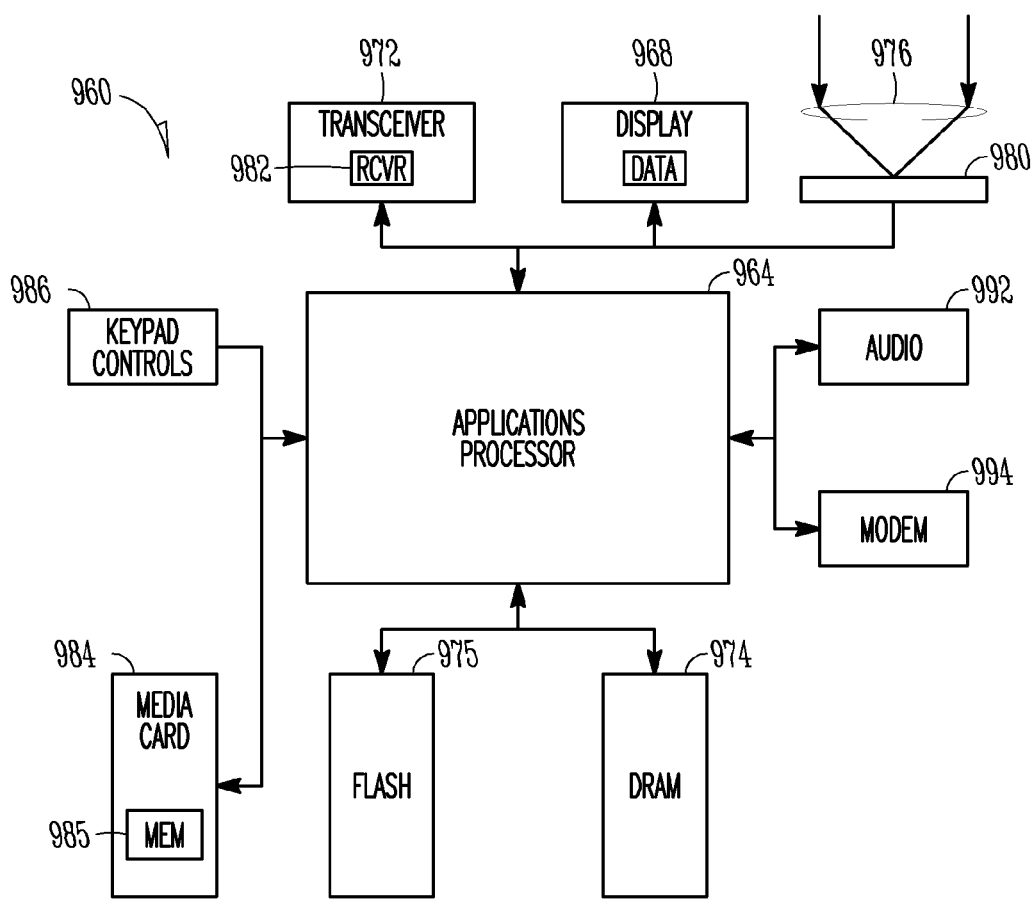
FIG. 9 is a block diagram of a system according to an embodiment of the invention.

FIG. 9 is a block diagram of a system 960 according to an embodiment of the invention. The system 960, in some embodiments, may include a processor 964 coupled to a display 968 and/or a wireless transceiver 972. The display 968 may be used to display data, perhaps received by the wireless transceiver 972. The system 960, in some embodiments, may include a memory device such as a DRAM 974 and/or a Flash memory 975. The processor 964 is coupled to exchange data with the DRAM 974 and the Flash memory 975. The DRAM 974 may be a SDRAM.

In some embodiments, the system 960 may include a camera including a lens 976 and an imaging plane 980 to couple to the processor 964. The imaging plane 980 may be used to receive light captured by the lens 976.

Many variations are possible. For example, in some embodiments, the system 960 may include a cellular telephone receiver 982 forming a portion of the wireless transceiver 972. The cellular telephone receiver 982 may also receive data to be processed by the processor 964, and displayed on the display 968. In some embodiments, the system 960 may include an audio, video, or multi-media player 984, including a memory device 985 and a set of media playback controls 986 to couple to the processor 964. The processor 964 may also be coupled to exchange data with an audio device 992 and/or a modem 994.

Any of the electronic components of the system 960 may include the IB system 200 shown in FIG. 2 with the IB limiter circuit 300 shown in FIG. 3 or the IB limiter circuit 700 shown in FIG. 7 according to embodiments of the invention described herein. For example, the processor 964, the DRAM 974, the Flash memory 975, or the memory device 985 includes circuits and receives external signals according to embodiments of the invention described herein.

Any of the circuits or systems described herein may be referred to as a module. A module may comprise a circuit and/or firmware according to embodiments of the invention.

The novel apparatus and systems of various embodiments may include and/or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods, as described above.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those skilled in the art upon reading and understanding the above description. Therefore, the scope of an embodiment of the invention is determined by the appended claims, along with the full range of equivalents to which such claims are entitled.

The Abstract is provided to comply with 37 C.F.R. §1.72(b) requiring an abstract that will allow the reader to quickly ascertain the nature of the technical disclosure. The Abstract is submitted with the understanding that it will not be used to interpret or limit the scope or meaning of the claims.

What is claimed is:

1. An apparatus comprising:
   an input terminal of a first transistor to receive an input signal;
   a control terminal of the first transistor to couple to a source of an electrical potential;
   a channel to be induced in the first transistor by the electrical potential of the control terminal, wherein conductivity of the channel between the input terminal and an output terminal of the first transistor is increased when the electrical potential of the control terminal is increased by the input signal; and
   a second transistor coupled in parallel with the first transistor in a component, the second transistor including a control terminal coupled to an internal supply voltage that is lower than an external supply voltage during a power down mode of operation of the component when the input signal is received.

2. The apparatus of claim 1, wherein the first transistor and the second transistor are in a buffer circuit in the component.

3. The apparatus of claim 1, wherein:
   the output terminal of the first transistor is configured to receive the input signal from the input terminal through the channel; and
   the input terminal, the control terminal, and the output terminal of the first transistor are configured to protect circuits coupled to the output terminal from electrostatic discharge from a port coupled to the input terminal.

4. The apparatus of claim 1, wherein the source of the electrical potential is a circuit configured to enable the increase of the electrical potential of the control terminal of the first transistor induced by an increase in the input signal.

5. A method comprising:
   receiving an input signal at an input terminal of a first transistor and a second transistor coupled in parallel with the first transistor in a component, the input signal to boost an electrical potential of a control terminal of the first transistor to increase conductivity of a channel between the input terminal and an output terminal of the first transistor; and
   lowering an electrical potential of a control terminal of the second transistor during a power down mode of operation of the component.

6. The method of claim 5, wherein receiving the input signal at the input terminal of the first transistor further comprises receiving a clock enable signal at the input terminal of the first transistor, the first transistor being configured to protect circuits coupled to the output terminal from electrostatic discharge.

7. The method of claim 5, wherein lowering an electrical potential of a control terminal of the second transistor further comprises lowering an internal supply voltage below an external supply voltage during the power down mode of operation of the component when the input signal is received at the input terminal of the first transistor, the internal supply voltage to be coupled to the control terminal of the second transistor, the second transistor being coupled between the input signal and the output terminal.

8. A method comprising:
   receiving an input signal at an input terminal of a first transistor and an input terminal of a second transistor in a component;

reducing an electrical potential of a control terminal of the first transistor; and enabling an increase of an electrical potential of a control terminal of the second transistor in response to an increase in the input signal to render the second transistor more conductive to the input signal.

9. The method of claim 8, wherein reducing the electrical potential of the control terminal of the first transistor further comprises:

coupling an internal supply voltage to the control terminal of the first transistor;

generating the internal supply voltage to render the first transistor conductive, the internal supply voltage being greater than an external supply voltage; and reducing the internal supply voltage below the external supply voltage during a power down mode of operation of the component.

10. The method of claim 8, further comprising:

charging the control terminal of the second transistor to an initial electrical potential before enabling the increase of the electrical potential of the control terminal of the second transistor.

11. The method of claim 8, wherein enabling an increase of the electrical potential of the control terminal of the second transistor further comprises:

enabling an increase of the electrical potential of the control terminal of the second transistor during a power down mode of operation of the component.

12. The method of claim 8, wherein receiving the input signal further comprises:

receiving a command signal having a transition to indicate an end to a power down mode of operation of the component.

13. The method of claim 8, wherein receiving the input signal at the input terminal of the first transistor and the input terminal of the second transistor comprises:

protecting circuits coupled to the first transistor and the second transistor from electrostatic discharge at a port configured to receive the input signal.

14. A system comprising:

a first component coupled to a bus to receive an input signal from a second component through a buffer circuit, the buffer circuit comprising:

a first transistor including an input terminal coupled to receive the input signal and a control terminal coupled to receive an internal supply voltage, the internal supply voltage being higher than an external supply voltage during a normal mode of operation of the first component and lower than the external supply voltage during a power down mode of operation of the first component; and a second transistor coupled in parallel with the first transistor, the second transistor including an input terminal coupled to the input terminal of the first transistor to receive the input signal, the second transistor including a control terminal at a voltage to be increased by the input signal on the input terminal to increase conductivity of the second transistor.

15. The system of claim 14, wherein:

the second component comprises a processor coupled to the bus to generate external command signals on the bus; and the first component comprises a dynamic random access memory device coupled to the bus to receive the external command signals, the input signal being one of the external command signals.

16. The system of claim 14, wherein the input signal comprises:

a clock enable signal to indicate a validity of a clock signal received by the first component.

17. The system of claim 14, wherein:

the first transistor includes an output terminal coupled to circuits; and the second transistor includes an output terminal coupled to the circuits, the input signal being coupled from the input terminals to the output terminals of the first transistor and the second transistor when at least one of the first transistor or the second transistor is switched on.

18. The system of claim 14, wherein:

the buffer circuit includes an electrostatic discharge protection circuit coupled to the input terminals of the first transistor and the second transistor; and the first transistor and the second transistor are included in a voltage limiter circuit, the electrostatic discharge protection circuit and the voltage limiter circuit being configured to protect circuits in the first component from electrostatic discharge.

19. The system of claim 14, wherein:

the first transistor comprises an n-type channel metal oxide semiconductor (MOS) pass gate transistor; and the second transistor comprises an n-type channel MOS pass gate transistor.

20. A method comprising:

receiving an input signal at an input terminal of a first transistor and an input terminal of a second transistor in a component;

receiving an internal supply voltage at a control terminal of the first transistor, the internal supply voltage being higher than an external supply voltage during a normal mode of operation of the component and lower than the external supply voltage during a power down mode of operation of the component; and enabling an increase of an electrical potential of a control terminal of the second transistor in response to an increase in the input signal to render the second transistor more conductive.

21. The method of claim 20, wherein receiving an input signal further comprises:

receiving a clock enable signal to indicate a validity of a clock signal.

22. The method of claim 20, further comprising:

charging the control terminal of the second transistor to an initial electrical potential before enabling the increase of the electrical potential of the control terminal of the second transistor.

23. The method of claim 20, wherein receiving the input signal further comprises:

receiving a command signal having a transition to indicate an end to the power down mode of operation in the component.

24. The method of claim 20, wherein receiving the input signal at the input terminal of the first transistor and the input terminal of the second transistor comprises:

protecting circuits coupled to the first transistor and the second transistor from electrostatic discharge at a port configured to receive the input signal.

25. A memory device comprising:

a memory array;

a control logic circuit coupled to the memory array to manage read and write operations in the memory array; and an input buffer circuit coupled to the control logic circuit to receive a command signal, the input buffer circuit comprising:
  a first transistor including an input terminal coupled to receive the command signal and a control terminal coupled to receive an internal supply voltage, the internal supply voltage being higher than an external supply voltage during a normal mode of operation of the memory device and lower than the external supply voltage during a power down mode of operation of the memory device; and
  a second transistor coupled in parallel with the first transistor, the second transistor including an input terminal coupled to the input terminal of the first transistor to receive the command signal, the second transistor including a control terminal at a voltage that is to be increased by the command signal on the input terminal to render the second transistor more conductive.

26. The memory device of claim 25, wherein the memory device comprises a dynamic random access memory device.

27. The memory device of claim 25, wherein:
the input buffer circuit includes an electrostatic discharge protection circuit coupled to the input terminals of the first transistor and the second transistor; and
the first transistor and the second transistor are included in a voltage limiter circuit, the electrostatic discharge protection circuit and the voltage limiter circuit being configured to protect circuits in the memory device from electrostatic discharge.

28. The memory device of claim 25, wherein the input buffer circuit is coupled to a bus to receive the command signal from a component coupled to the bus.

29. The memory device of claim 28, wherein the component comprises a processor coupled to the bus to generate external command signals on the bus including the command signal.

30. The memory device of claim 29, wherein the command signals comprise at least one of:
  a chip select signal;
  a clock signal;
  a clock enable signal to indicate a validity of the clock signal;
  a row address strobe signal to capture an address input and open a row in the array corresponding to the address input;
  a column address strobe signal to capture an address input and select a column in the memory array corresponding to the address input;
  a write enable signal to determine whether the column address strobe signal initiates a read operation or a write operation; or
  a data-mask signal to control data input and data output between the memory device and a data bus.

* * * * *